(12) United States Patent
Punzalan et al.

(10) Patent No.: US 6,630,373 B2
(45) Date of Patent: Oct. 7, 2003

(54) GROUND PLANE FOR EXPOSED PACKAGE

(75) Inventors: Jeffrey D. Punzalan, Singapore (SG); Hien Boon Tan, Singapore (SG); Zheng Zheng, Singapore (SG); Jae Hak Yee, Singapore (SG); Byung Joon Han, Singapore (SG)

(73) Assignee: St Assembly Test Service Ltd., Singapore (SG)

( * ) Notice: Subject to any disclaimer, the term of this patent is extended or adjusted under 35 U.S.C. 154(b) by 0 days.

(21) Appl. No.: 10/083,993

(22) Filed: Feb. 26, 2002

(65) Prior Publication Data

US 2003/0160309 A1 Aug. 28, 2003

(51) Int. Cl.[7] .............................................. H01L 21/44
(52) U.S. Cl. ...................... 438/123; 438/124; 438/112; 438/127
(58) Field of Search ................................ 438/123, 124, 438/112, 127; 257/676, 666, 691, 670

(56) References Cited

U.S. PATENT DOCUMENTS

| 5,434,750 | A | | 7/1995 | Rostoker et al. ............. 361/784 |
| 6,008,073 | A | * | 12/1999 | King et al. ................... 438/123 |
| 6,096,163 | A | | 8/2000 | Wensel ........................ 156/357 |
| 6,284,571 | B1 | | 9/2001 | Corisis et al. ............... 438/112 |
| 6,300,673 | B1 | | 10/2001 | Hoffman et al. ............ 257/666 |

* cited by examiner

Primary Examiner—David L. Talbott
Assistant Examiner—Luan Thai
(74) Attorney, Agent, or Firm—George O. Saile; Stephen B. Ackerman

(57) ABSTRACT

A new design is provided for the design of a leadframe of a semiconductor package. A ground plane is added to the design of the leadframe, the ground frame is located between the leadframe and the die attach paddle over which the semiconductor device is mounted.

15 Claims, 7 Drawing Sheets

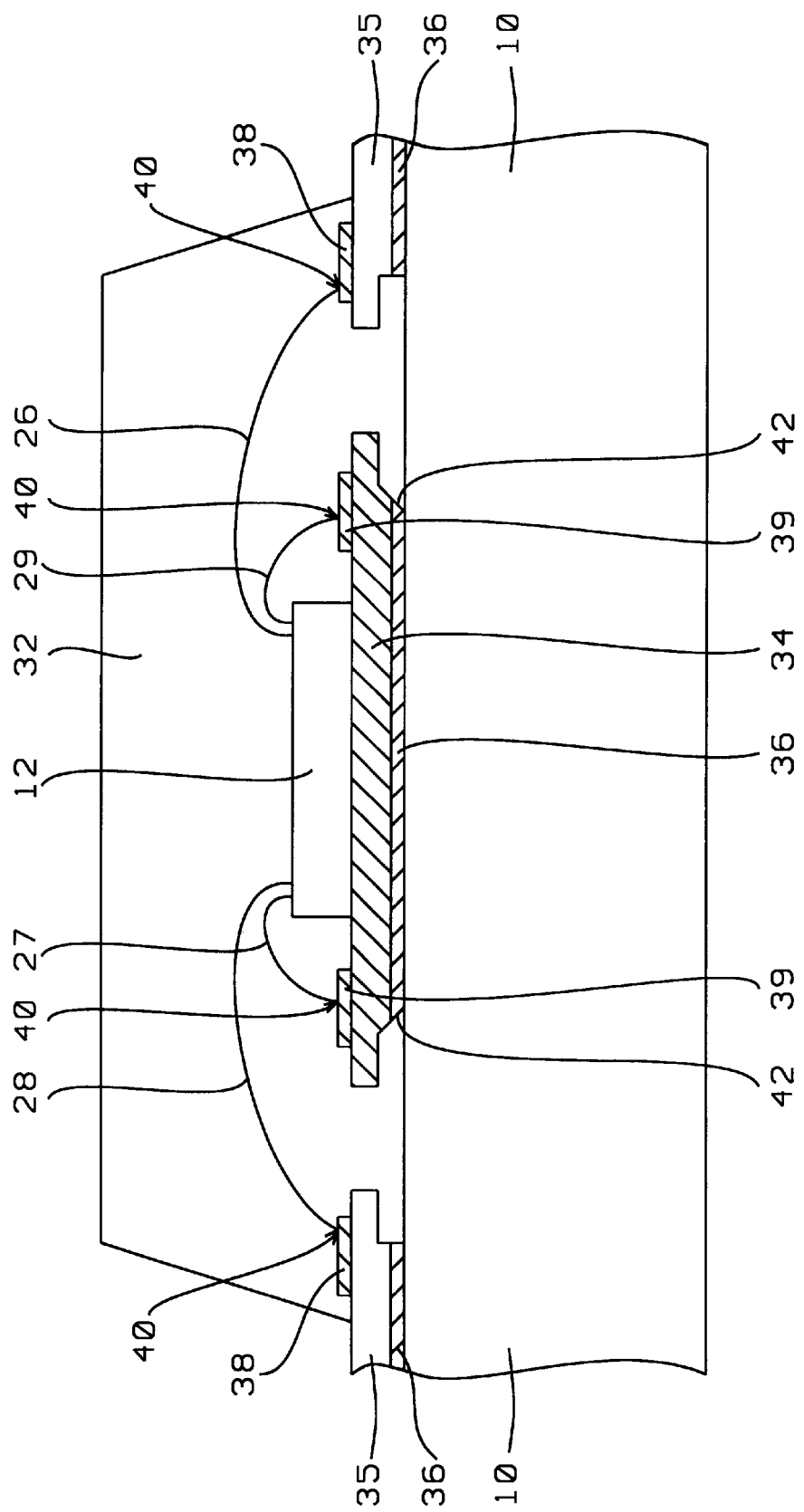
FIG. 1 – Prior Art

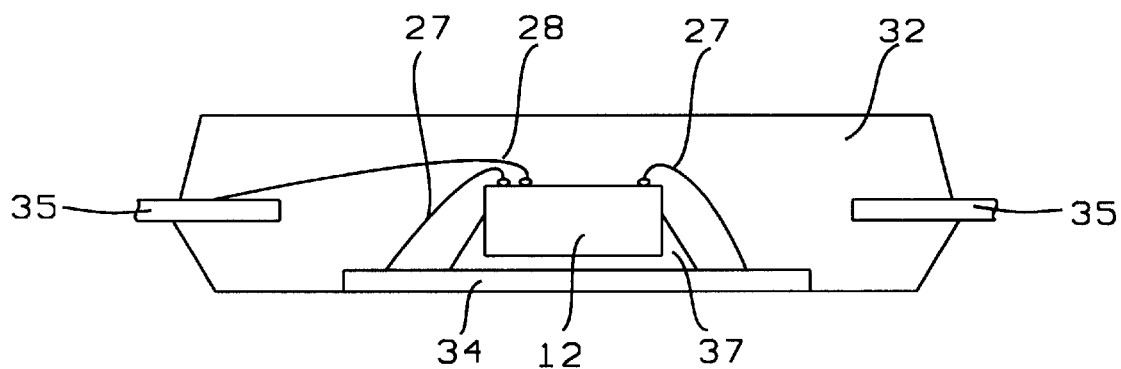
FIG. 2 — Prior Art
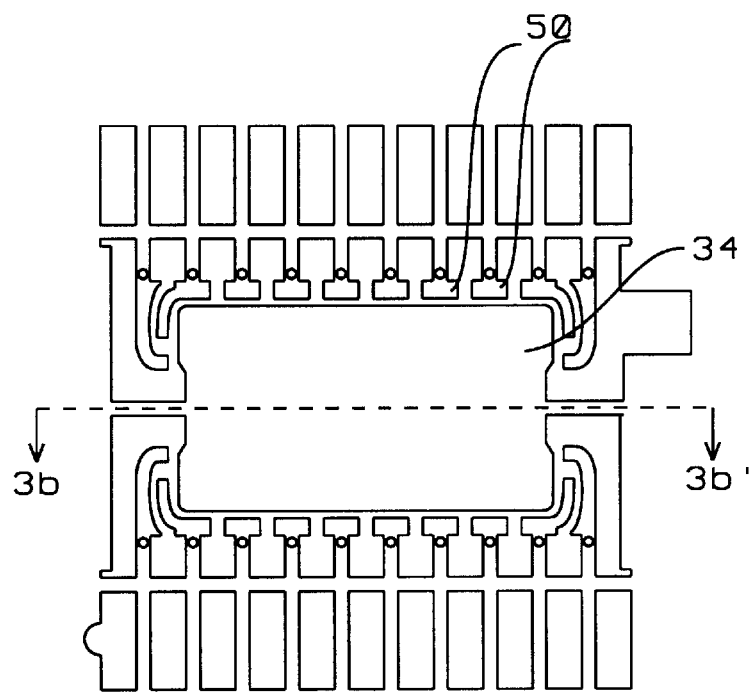
FIG. 3a — Prior Art
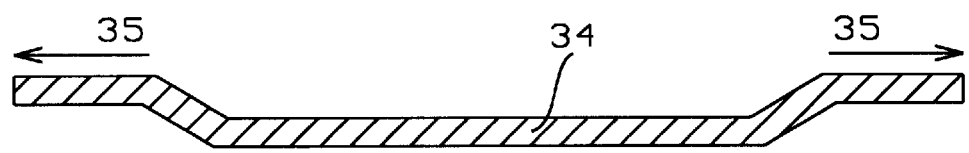
FIG. 3b — Prior Art

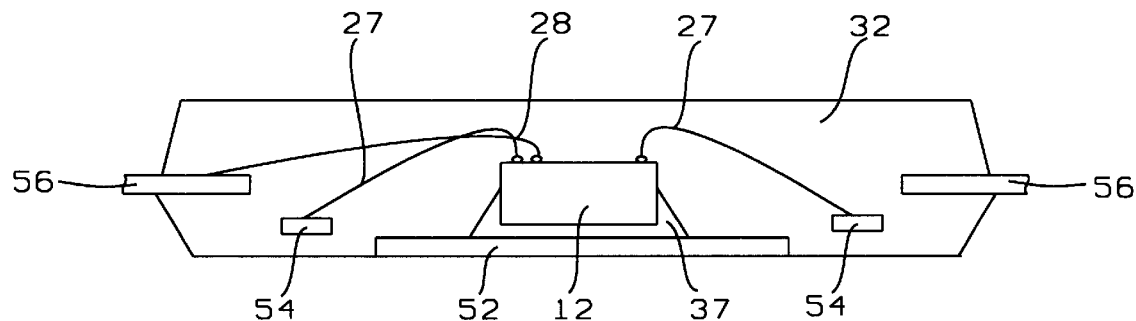
FIG. 4
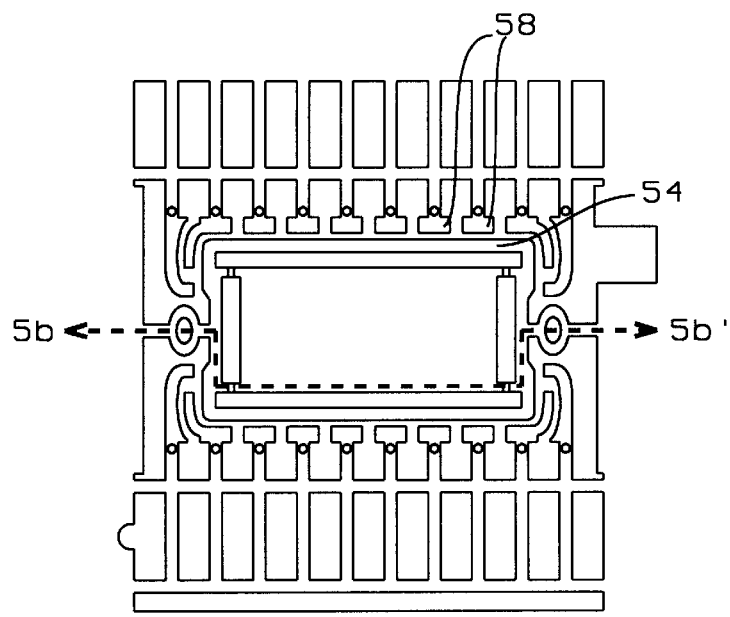
FIG. 5a - Prior Art
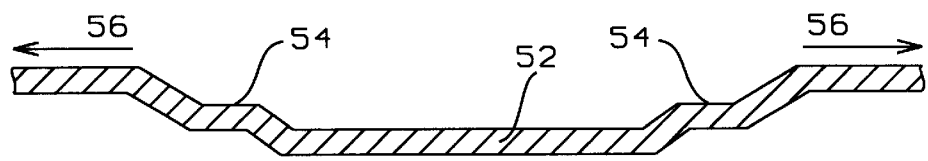
FIG. 5b - Prior Art

GROUND PLANE FOR EXPOSED PACKAGE

BACKGROUND OF THE INVENTION (1) Field of the Invention

The invention relates to the fabrication of integrated circuit devices, and more particularly, to an improved design of a semiconductor die paddle.

(2) Description of the Prior Art

The semiconductor industry has for many years achieved improvements in the performance of semiconductor devices by device miniaturization and by increasing the device packaging density. For this purpose, metal interconnects can readily be provided by metal lines that are embedded in layers of dielectric, using vias to provide electrical connections between overlying layers of interconnect lines. Interconnect lines must thereby be connected in such a manner that optimum performance can be realized for the completed package. Good planarity must also be maintained between adjacent layers of interconnect lines because metal interconnect lines are typically narrow in width and thick in a vertical direction (in the range of 5 to 10 microns thick) and must be patterned with microlithography. Patterned layers must therefore be substantially flat and smooth (i.e. have good planarity) so that these layers can serve as a base for the next layer.

One of the original approaches that has been used to create surface mounted, high pin-count integrated circuit packages has been the use of the Quad Flat Pack (QFP) with various pin configurations. For the QFP, closely spaced leads along the four edges of the flat package are used for making electrical connections from where the electrical connections are distributed to the surrounding circuitry. The QFP has found to be cost-effective for semiconductor devices where the device I/O pin count does not exceed 200. To circumvent this limitation, a new package, a Ball Grid Array (BGA) package has been introduced. For the BGA package, the electrical contact points are distributed over the entire bottom surface of the package. More contact points with greater spacing between the contact points can therefore be allocated across the BGA package than was the case with the QFP.

Flip Chip packages have in general been used to accommodate increased I/O count combined with increased high requirements for high performance Integrated Circuits. Flip chip technology fabricates bumps (typically Pb/Sn solder) on aluminum pads and interconnects the bumps directly to the packaging media, which are usually ceramic or plastic based substrates. The flip-chip is bonded face down to the package through the shortest paths. This approach can be applied to single-chip packaging and to higher levels of integrated packaging (in which the packages are larger) and to more sophisticated packaging media that accommodate several chips to form larger functional units.

For the packaging of semiconductor devices, the packages in which the devices are contained provide protection of the device from environmental influences such as mechanical damage or damage caused by moisture affecting exposed surfaces of the device. Part of the package design includes the design of electrically conductive interfaces that enable the device to be electrically interconnected with surrounding circuitry. Increased device density has not only created new demands for input/output connections of the device but has also caused considerable more thermal energy to be expanded per cubic volume content of the device. In many of the semiconductor device packages, the device is mounted in close physical proximity to a heat sink. This is combined with methods, such as connections of low resistance to thermal heat conductivity, that are implemented as part of the package.

U.S. Pat. No. 6,300,673 (Hoffman et al.) shows a die attach paddle and ground plane for a package.

U.S. Pat. No. 6,284,571 B1 (Corisis et al.) describes a structure for a die attach paddle and ground plane for a package.

U.S. Pat. No. 6,096,163, (Wensel) shows a process for adhesives to a leadframe.

U.S. Pat. No. 5,434,750 (Rostoker) shows another leadframe design.

SUMMARY OF THE INVENTION

A principle objective of the invention is to provide improved bond reliability for wire bond interfaces of a semiconductor package.

Another objective of the invention is to reduce stress related problems in a semiconductor package.

Yet another objective of the invention is to reduce the impact of mismatched Coefficients of Thermal Expansion (CTE) between components of a semiconductor device package.

In accordance with the objectives of the invention a new design is provided for the design of a leadframe of a semiconductor package. A ground plane is added to the design of the leadframe, the ground plane is located between the leadframe and the die attach paddle over which the semiconductor device is mounted.

BRIEF DESCRIPTION OF THE DRAWINGS

FIG. 1 shows a cross section of a first Prior Art exposed pad package.

FIG. 2 shows a cross section of a second Prior Art exposed pad package.

FIGS. 3a and 3b respectively show a top view and a cross section of a conventional leadframe design.

FIG. 4 shows a cross section of a semiconductor package in which the leadframe design of the invention, incorporating therein a ground plane, has been applied.

FIGS. 5a and 5b respectively show a top view and a cross section of a first leadframe design of the invention.

DESCRIPTION OF THE PREFERRED EMBODIMENTS

Figure 6:
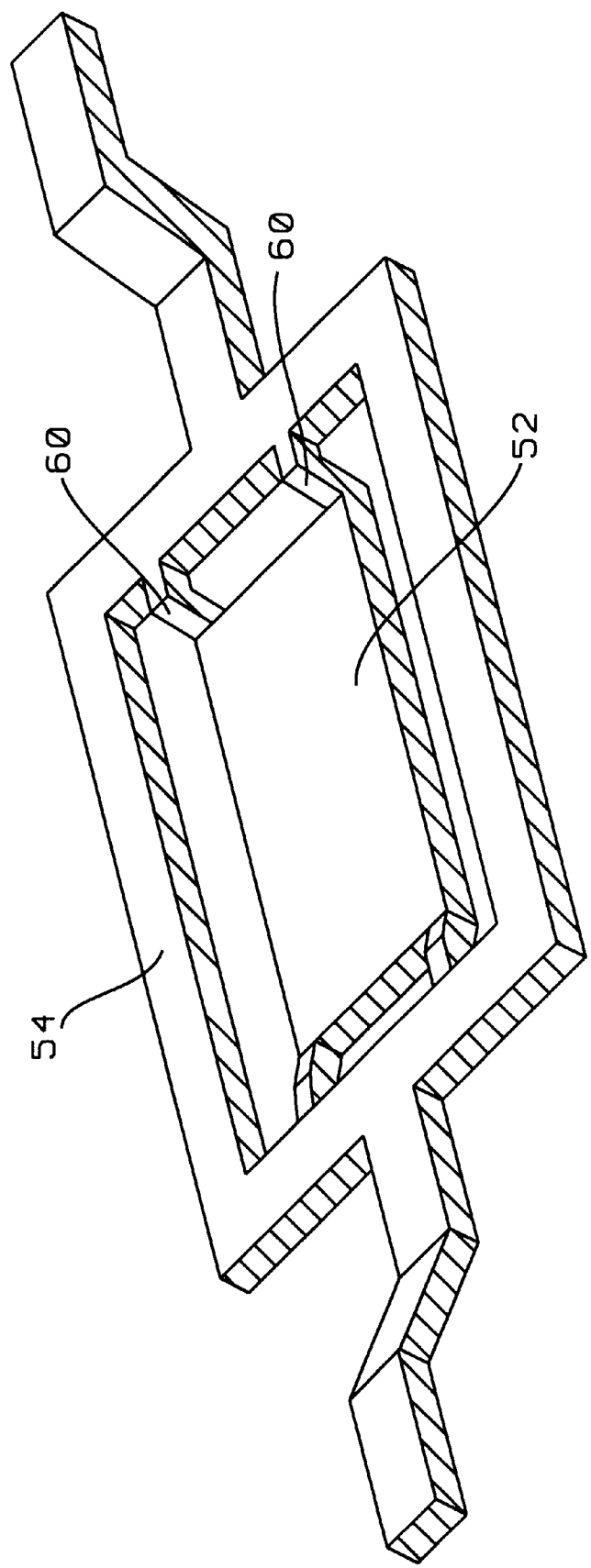
FIG. 6 shows a three dimensional view of a leadframe design of the invention.

An integral part of a number of semiconductor packages is a heat spreader or heat sink that is thermally interconnected to areas or surfaces surrounding the die that is mounted in the package. An encapsulation mold or mold compound typically surrounds the die and further encapsulates bond wires that are connected to points of electrical contact on the active surface of die and that interconnect the die with electrical traces for further interconnection of the die to surrounding circuitry. The semiconductor die of the package is typically mounted over a die-paddle, the purpose of the die-paddle is to enable and to enhance heat dissipation from the die to surrounding surfaces, typically the surface of a heat sink. A leadframe provides support for the metal traces that connect the semiconductor device with surrounding circuitry.

One of the more serious problems that is encountered in the application of die-paddles is the problem of delamination, which occurs at exposed die-paddle surfaces. Improvements of the electrical performance of the packaged semiconductor device is typically achieved by proper grounding of the die with for instance ground wires between the die and the die-paddle or between the die-paddle-and surrounding ground connections. A remaining problem however is delamination that occurs in the interface between the mold compound and surfaces that are silver plated for improved contact resistance and improved connectivity thereto. Where the die-paddle is exposed, this problem can be especially severe since such an exposure offers a ready path of moisture penetration into the mold compound. Added to the severity of this problem are such factors as mismatch of the Coefficient of Thermal Expansion (CTE) between adjacent surfaces or components, weak interlocking mechanisms and exposure of bonded surfaces, through an exposed die-paddle, to drastic environmental changes such as changes in temperature during reflow processing.

The invention addresses these concerns by providing a unique leadframe configuration, which takes into account considerations of improved interlocking of adjacent elements of the package of a semiconductor die and of proper shielding of sensitive areas against drastic environmental changes. The design of the invention provides reduced delamination.

For purposes of increased understanding of the invention and to more clearly differentiate between prior art methods and the invention, prior art methods of creating a semiconductor package in which a leadframe and die-paddle are applied are first briefly highlighted.

FIG. 1 shows a prior art method of packaging a semiconductor device, shown in FIG. 1 are the following elements:

10, a heat sink or a Printed circuit Board (PCB) over which the semiconductor device 12 is mounted 12, a semiconductor die that is mounted in the package of the cross section shown in FIG. 1

26 and 28, two signal wires that interconnect points 38 of electrical contact on the surface of leadframe 35 with points of electrical contact (not shown) provided over the active surface of die 12; these signal wires interconnect the die 12 with metal traces 38 for further interconnection of the die 12 to surrounding circuitry 27 and 29, two ground wires that provide short and low resistivity ground interconnects between the ground points (not shown) on the surface of die 12 and ground points of interconnect 39 on the surface of the die-paddle 34

32, an encapsulation or molding compound that surrounds die 12 and that further encapsulates bond wires 26, 27, 28 and 29

34, a cross section of the exposed die-paddle on the surface of which semiconductor die 12 is mounted; the purpose of the die-paddle 34 is to enable and to enhance heat dissipation from the die 12 to surrounding surfaces, typically the surface of heat sink 10; in addition the die-paddle 34 provides the ability for short and improved ground connections between the die 12 and the heat sink or Printed Circuit Board (PCB) 10

35, the leadframe providing support for metal traces 38 that connect the semiconductor device 12 with surrounding circuitry; it must be noted that elements 34 (the die-paddle) and metal traces 38 and 39 are all part of and constitute the leadframe 35

36, solder plating that is used as an interface between the leadframe 35 and the heat sink/PCB 10

38 and 39, a (silver) plating base that is created on the surface of leadframe 35 and the die-paddle 34 for purposes of providing points of electrical interconnect for bond wires 26–29

The cross-section that is shown in FIG. 1 is hereby used to specifically indicate above highlighted problem areas that arise using the conventional method of mounting a semiconductor device, of which the cross-section of FIG. 1 is representative. These problems are:

the areas highlighted as areas 40, which are the points where the bond wires 26–29 connect to the plating base 38 and 39; it has been found that bond reliability at these points is poor, leading to high product-yield losses; this effect is especially acute during solder reflow and is caused by the significant mismatch of the Coefficient of Thermal Expansion (CTE) between the interfacing elements the areas highlighted as areas 42, these areas of exposure provide paths of relatively easy moisture penetration during the process of assembly of the package; the moisture that penetrates in this manner is prone to evaporate during reflow and during high temperature processing, causing additional stress and subsequent delamination in the surface of the die-paddle.

The problem of the device package that is shown in FIG. 1 can be summarized as follows. Die-paddle delamination has been a major problem for die-paddles that are exposed during the process of assembling the package. Electrical performance is typically enhanced by providing proper grounding of the semiconductor device with, as previously highlighted, providing bonding wires between the die and the die-paddle and from the die-paddle leads to ground. However, reliability of the therefore required bonding interconnections is significantly compromised by delamination of the solder plating 36 that is used as an interface between the leadframe (points 42, FIG. 1) and the silver plating interface (points 40, FIG. 1). Especially, for products that contain a die-paddle that is exposed during the process of package assembly, the moisture penetration is of more serious concern than for product that contains a standard embedded die-paddle.

The primary factors causing delamination of the top surface of the die-paddle (points 40, FIG. 1) are:

mismatch of the Coefficient of Thermal Expansion (CTE) between interfacing surfaces and materials a weak interlocking mechanism between the epoxy that is used in the package and the leadframe of the package, and exposure of bonded surfaces (through the exposed die-paddle) to drastic changes in environmental conditions such as changes in temperature or moisture exposure.

A second conventional method of mounting semiconductor devices is shown in the cross section of FIG. 2, in which the following elements are highlighted:

12, the mounted semiconductor die 27, ground wires 28, a signal wire, wire bonded between the active surface of die 12 and a point of contact (not shown) on the surface of leadframe 35

32, the molding compound that is used to encapsulate die 12 and therewith-connected bond wires 34, the die paddle of the package over the surface of which die 12 is mounted 35, the leadframe, surrounding die paddle 34 and the thereover mounted die 12, used for providing additional conductive interconnects (not shown) between die 12 and surrounding circuitry (not shown), and 37, a die attach paste, applied for interfacing between die 12 and die paddle 34, providing a thermally conductive path between these latter two elements.

The die paddle 34 functions as a heatsink to dissipate the heat that is generated by the semiconductor device 12. Such a heat sink is typically soldered to a Printed Circuit Board 10 in order to achieve improved heat dissipation. Thermally conductive layer 37 is provided for this purpose, creating a path of heat dissipation that comprises the die attach paste 37, the die attach paddle 34, interfacing solder interconnects (not shown) and the PCB 10.

Ground wires 27 can further be provided between the active surface of die 12 and the die paddle 34. The invention specifically addresses providing a ground plane, by expanding the leadframe of a semiconductor package, thereby addressing:

providing improved bond reliability reducing stress related defects in the package, and reducing effects of mismatch of CTE for thermally interacting elements of the package.

FIG. 3a shows a top view of a conventional leadframe design, wherein specifically are highlighted the elements:

50, the inner leads of the leadframe, and 34, the die attach paddle.

A cross section of the die-attach paddle, taken along the line 3a-3a' of the top view of FIG. 3a, is shown in FIG. 3b. The direction in which leadframe 35 is located with respect to the die paddle 34 is highlighted in the cross section of FIG. 3b.

The cross section that is shown in FIG. 4 shows the new arrangement of the invention by showing a cross section of the die-paddle, the ground plane of the invention and the leadframe. Highlighted in the cross section of FIG. 4 are the now familiar elements of the package with additionally highlighted:

52, the die attach paddle 54, the ground plane of the invention, and 56, the leadframe.

Although in the cross section that is shown in FIG. 2 the leadframe (35) and the die attach paddle (34) are part of this cross section, these elements are highlighted in the cross section of FIG. 4 as new elements. It must thereby be remembered that these latter two elements of die attach paddle and leadframe are not in themselves modified by the invention but form part of a new arrangement of the invention whereby, FIG. 4, the ground plane 54 is interposed between the die attached paddle 52 and the leadframe 56. The overall structure of die attach paddle-ground plane-leadframe is therefore provided as a new unit of new and innovative design. Ground plane 54 of the invention is part of the leadframe 56. This is further highlighted in FIGS. 5a and 5b.

FIG. 5a shows a top view of a leadframe of the invention, wherein specifically are highlighted the ground plane 54 and the inner leads 58 of the leadframe. The cross section that is shown in FIG. 5b is taken along the line 5b-5b' shown in FIG. 5a. The construction as shown in cross section in FIG. 5b, clearly highlights the interposition of the ground plane 54 between the die attach paddle 52 and the leadframe 56.

FIG. 6 shows a three dimensional view of the die attach paddle 52 with the thereto attached ground plane 54. The attachment between the die attach paddle 52 and the ground plane 54 is achieved by means of tie-bars 60. It must be noted in the three dimensional view that is shown in FIG. 6 that there is an offset between the plane of the ground plane 54 and the plane of the die attach paddle 52, an offset that is obtained by a mechanical down-set process which moves the tie bars 60 in a downward sloping angle from the plane of the ground plane 54.

Figure 7A:
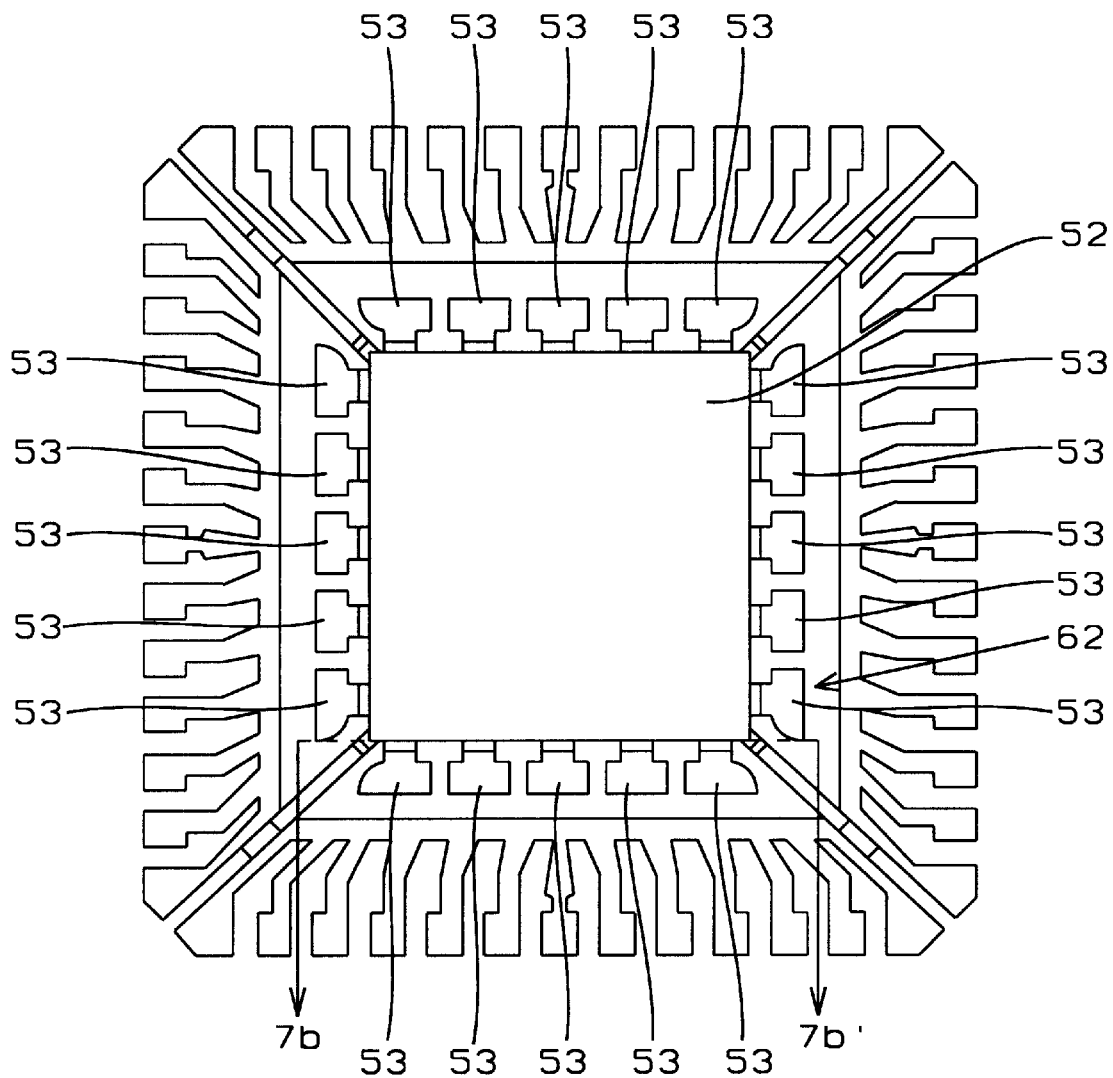
FIGS. 7a and 7b respectively show a top view and a cross section of a second leadframe design of the invention.
Figure 7B:
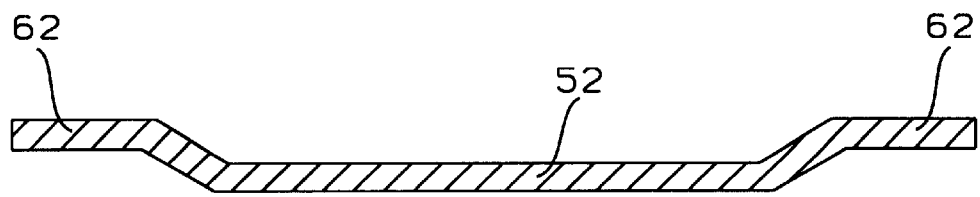

The ground plane is not limited to being created using straight bars or straight metal strips surrounding the die attach paddle. This is illustrated using FIGS. 7a and 7b, where the ground plane 62 (not highlighted in FIGS. 7a and 7b) has been shown as comprising small, metal constructs 53 surrounding the die attach panel 52. The cross section that is shown in FIG. 7b is taken along the line 7b-7b' shown in FIG. 7a. The small, metal constructs 53 are surrounded, in accordance with the cross section of FIG. 4, by the molding compound 32, which therefore forms a shield around the small, metal constructs 53. From this results that the bottom surfaces of the small metal constructs 53 are not exposed while the bottom surface of the die paddle 52 will be exposed for reasons of thermal dissipation. The interfacing between the small, metal constructs 53 and the surrounding mold compound provides additional stress relieve and improved interlocking between the die attach paddle 52, the ground plane 54 and the leadframe (56, FIG. 4), thus providing enhanced reliability of the wire bonded interconnects that are provided to the surface of the small, metal constructs 53.

Figure 8A:
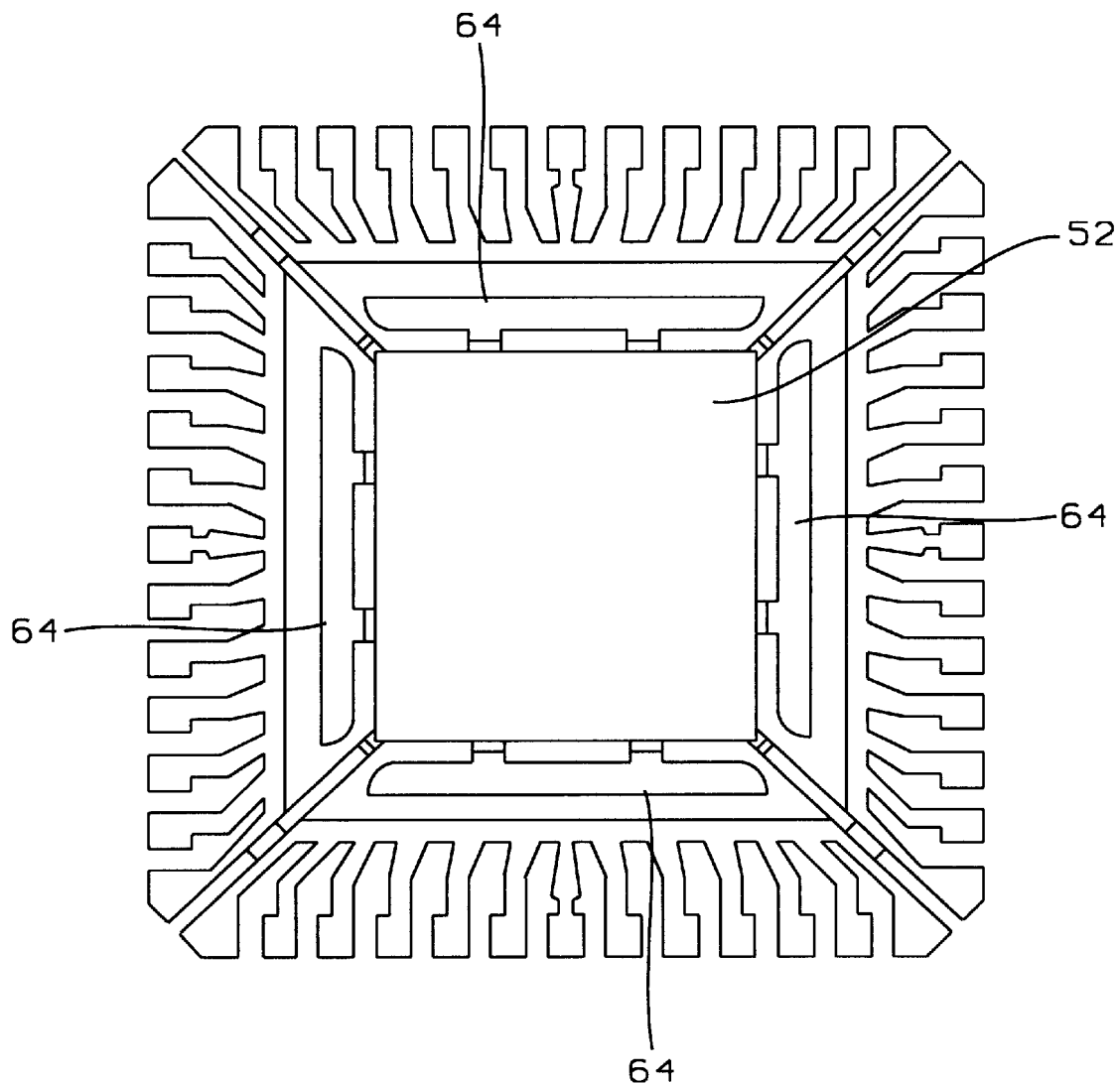
FIGS. 8a and 8b respectively show a top view of a third and a fourth leadframe design of the invention.
Figure 8B:
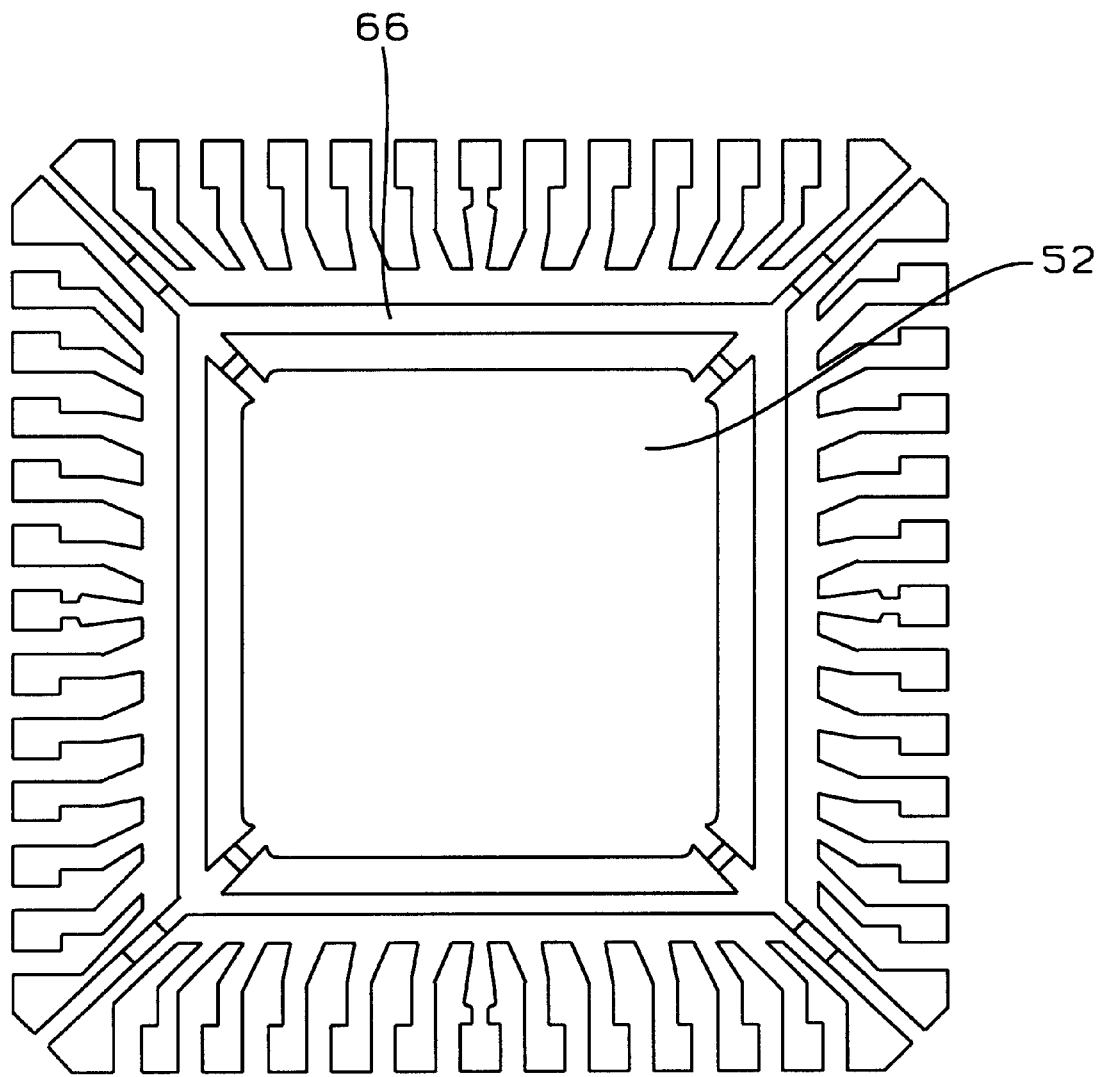

Additional alternatives for the creation of the ground plane of the invention are highlighted in FIGS. 8a and 8b, whereby longer metal bars 64 (FIG. 8a) or a contiguous frame 66 (FIG. 8b), attached at corners of the die attach paddle 52, are shown.

The method that is used for the creation of the semiconductor package of the invention comprises the steps of:

providing a semiconductor die providing the leadframe/ground plane/die paddle attach arrangement of the invention providing a layer of die attach paste over the surface of the die attach paddle positioning the semiconductor die over the layer of die attach paste, thereby positioning the die over the die attach paddle providing conductive interconnects between the die and surrounding points of electrical contact by:

1. providing conductive interconnects of signal wires, ground wires and power wires between points of electrical contact on the active surface of the semiconductor die and points of electrical contact on the surface of the lead frame, and 2. providing conductive interconnects of ground wires between points of electrical contact on the active surface of the semiconductor die and (the surface of) the ground plane of the invention encapsulating the semiconductor die and the conductive interconnects that are connected to the active surface of the die in a mold compound, overlying the surface of the die attach paddle, further partially enclosing the lead frame of the package.

To summarize the invention, by providing a ground plane that physically interfaces between the die attach paddle and the lead frame of the package, the invention has provided for:

improved connectivity between the die and surrounding surfaces, most notably between ground points on the active surface of the die and surrounding points of ground interconnect improved mechanical interfacing between the die attach paddle/ground plane/lead frame and the mold compound of the package reduced exposure of ground interconnects of the package reduced exposure to effects of mismatch of the CTE of thermally interfacing components of the package removed the need for making ground connections to the die attach paddle of the package, replacing these ground connections with ground connection to the ground plane of the invention, and reduced the exposure of bonded surfaces since the ground plane of the invention is embedded in a mold compound after this mold compound has been applied.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating a semiconductor device package, comprising the steps of:

providing a semiconductor device;

providing a leadframe, conductive traces having been provided over the surface of said lead frame;

providing a ground plane, said ground plane forming a physical and thereto connected interface between said die attach paddle and said lead frame, a plane of said ground plane being interposed between a plane of said die attach paddle and a plane of said lead frame, a plane of said ground plane being parallel with a plane of said die attach paddle, a plane of said ground plane further being parallel with a plane of said lead frame;

depositing a layer of die attach paste over the surface of said die attach paddle;

mounting said semiconductor device over said layer of die attach paste, thereby mounting said semiconductor device over said die attach paddle;

providing first conductive interconnects between points of electrical contact on an active surface of the semiconductor die and said conductive traces having been provided over the surface of said lead frame;

providing second conductive interconnects between points of electrical contact on an active surface of the semiconductor die and said ground plane; and providing a mold compound overlying said die attach paddle, further enclosing said ground plane, further enclosing said first and second conductive interconnects, further enclosing said lead frame by a measurable amount.

2. The method of claim 1, said first conductive interconnects being selected from the group consisting of signal wires and ground wires and power wires.

3. The method of claim 1, said second conductive interconnects comprising ground wires.

4. The method of claim 1, said physical and thereto connected interface between said die attach paddle and said lead frame comprising metal interconnects in metal strip form, a plane of said metal interconnects intersecting a plane of said die attach paddle under an angle.

5. The method of claim 1, said ground plane comprising an uninterrupted frame spatially surrounding said die attach paddle, said ground plane comprising a square or rectangular geometric shape when viewed in top view.

6. The method of claim 1, said ground plane comprising separated layers of metal spatially surrounding said die attach paddle, said ground plane comprising a square or rectangular geometric shape when viewed in top view.

7. A method of creating a semiconductor device package, comprising the steps of:

providing a semiconductor device;

providing a leadframe, conductive traces having been provided over the surface of said lead frame;

providing a ground plane, said ground plane forming a physical and thereto connected interface between said die attach paddle and said lead frame, a plane of said ground plane being interposed between a plane of said die attach paddle and a plane of said lead frame, a plane of said ground plane being parallel with a plane of said die attach paddle, a plane of said ground plane further being parallel with a plane of said lead frame;

depositing a layer of die attach paste over the surface of said die attach paddle;

mounting said semiconductor device over said layer of die attach paste, thereby mounting said semiconductor device over said die attach paddle;

providing first conductive interconnects between points of electrical contact on an active surface of the semiconductor die and said conductive traces having been provided over the surface of said lead frame, first conductive interconnects being selected from the group consisting of signal wires and ground wires and power wires;

providing second conductive interconnects between points of electrical contact on an active surface of the semiconductor die and said ground plane; and providing a mold compound overlying said die attach paddle, further enclosing said ground plane, further enclosing said first and second conductive interconnects, further enclosing said lead frame by a measurable amount.

8. The method of claim 7, said second conductive interconnects comprising ground wires.

9. The method of claim 7, said physical and thereto connected interface between said die attach paddle and said lead frame comprising metal interconnects in metal strip form, a plane of said metal interconnects intersecting a plane of said die attach paddle under an angle.

10. The method of claim 7, said ground plane comprising an uninterrupted frame spatially surrounding said die attach paddle, said ground plane comprising a square or rectangular geometric shape when viewed in top view.

11. The method of claim 7, said ground plane comprising separated layers of metal spatially surrounding said die attach paddle, said ground plane comprising a square or rectangular geometric shape when viewed in top view.

12. A method of creating a semiconductor device package, comprising the steps of:

providing a semiconductor device;

providing a leadframe, conductive traces having been provided over the surface of said lead frame;

providing a ground plane, said ground plane forming a physical and thereto connected interface between said die attach paddle and said lead frame, a plane of said ground plane being interposed between a plane of said die attach paddle and a plane of said lead frame, a plane of said ground plane being parallel with a plane of said die attach paddle, a plane of said ground plane further being parallel with a plane of said lead frame;

depositing a layer of die attach paste over the surface of said die attach paddle;

mounting said semiconductor device over said layer of die attach paste, thereby mounting said semiconductor device over said die attach paddle;

providing first conductive interconnects between points of electrical contact on an active surface of the semiconductor die and said conductive traces having been provided over the surface of said lead frame, first conductive interconnects being selected from the group consisting of signal wires and ground wires and power wires;

providing second conductive interconnects between points of electrical contact on an active surface of the semiconductor die and said ground plane, said second conductive interconnects comprising ground wires; and providing a mold compound overlying said die attach paddle, further enclosing said ground plane, further enclosing said first and second conductive interconnects, further enclosing said lead frame by a measurable amount.

13. The method of claim 12, said physical and thereto connected interface between said die attach paddle and said lead frame comprising metal interconnects in metal strip form, a plane of said metal interconnects intersecting a plane of said die attach paddle under an angle.

14. The method of claim 12, said ground plane comprising an uninterrupted frame spatially surrounding said die attach paddle, said ground plane comprising a square or rectangular geometric shape when viewed in top view.

15. The method of claim 12, said ground plane comprising separated layers of metal spatially surrounding said die attach paddle, said ground plane comprising a square or rectangular geometric shape when viewed in top view.

* * * * *